United States Patent [19]

Miida

[11] Patent Number: 5,038,214

[45] Date of Patent: Aug. 6, 1991

[54] PEAK LEVEL DETECTING APPARATUS FOR IMAGE SENSORS WHICH PREVENTS SATURATION

[75] Inventor: Takashi Miida, Kanagawa, Japan

[73] Assignee: Fuji Photo Film Co., Ltd., Kanagawa, Japan

[21] Appl. No.: 321,787

[22] Filed: Mar. 10, 1989

[30] Foreign Application Priority Data

Mar. 10, 1988 [JP] Japan .................................. 63-54789

[51] Int. Cl.$^5$ ............................................. H04N 3/14
[52] U.S. Cl. ............................ 358/213.11; 358/213.19
[58] Field of Search ..................... 358/213.19, 213.15, 358/213.22, 213.11

[56] References Cited

U.S. PATENT DOCUMENTS

| 4,626,915 | 12/1986 | Takatsu | 358/213.19 |
| 4,628,364 | 12/1986 | Koch | 358/213.19 |
| 4,635,126 | 1/1987 | Kinoshita | 358/213.19 |

Primary Examiner—Glen R. Swann, III
Assistant Examiner—Jill Jackson

[57] ABSTRACT

A peak level detecting apparatus for image sensors by which the maximum light value of a remote object is detected effectively utilizing the dynamic range of image sensors. The peak level detecting apparatus realizes a detection of the remote object patterns without any saturation in photoelectric devices by adjusting the exposure time with the detection of induced signal change in at least one of the photoelectric devices reaching the predetermined peak level, in order to improve the dynamic range and the signal to noise ratio.

16 Claims, 5 Drawing Sheets

PEAK LEVEL DETECTING APPARATUS FOR IMAGE SENSORS WHICH PREVENTS SATURATION

BACKGROUND OF THE INVENTION

The present invention relates to a peak level detecting apparatus, and more particularly to a peak level detecting apparatus for image sensors by which the maximum light value of a remote object is detected effectively utilizing the dynamic range of image sensors.

In recent years, technology utilizing a photoelectric device for an image sensor has been developed for optical devices such as for cameras. For example, a charge coupled device has been employed as an automated range finding apparatus or automated exposure controller apparatus for still cameras. The automated range finding apparatus comprise a couple of line image sensors (which are made up of plural photoelectric devices such as photo diodes linearly aligned) arranged at different distances from an optical axis to output signal charges which are induced in photo-electric devices through a charge coupled devices (CCD). Each signal charge corresponds to a specific part of the optical image of the remote object, therefore, by correlating the patterns of signal charges from these couple of line image sensors, the phase difference of these patterns makes it possible to calculate the distance to the remote object.

For the precise detection of the phase difference, it is required to receive signals from the remote object within the dynamic range of the line image sensors and CCD. Heretofore, because these devices are saturated over the dynamic range by receiving too great an incident signal, a part of the pattern from the signal is clipped. Consequently, the correlation measurement is accomplished for patterns different from the actual ones. Due to this fact, the phase difference measurement result contains error and precision range finding could not be achieved.

To improve the accuracy of the phase difference measurement, heretofore, it was proposed that the exposure process be stopped when the average of each charge reaches a predetermined threshold level to attain charge patterns without clipping for precise range finding by detection of the signal charge amount induced in each photo electric device.

Figure 7:
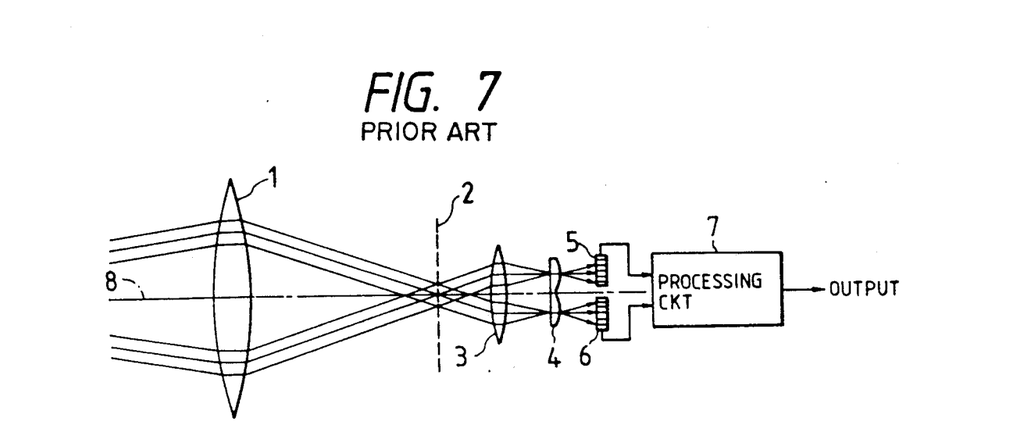
FIG. 7 is a schematic diagram of one example of an automated range finding system in the prior art.

In FIG. 7, one example of a phase difference detector for a range finding apparatus of the aforementioned prior art method is illustrated. The detector comprises lens assembly (1), image forming means (2) which is arranged at the back of the lens assembly (1), condensing lens (3), separating lens (4) and phase a difference detector which are arranged at the back of the image forming means (2) in the above-mentioned order parallel to the light axis of the apparatus. The aforesaid phase difference detector comprises a couple of line image sensors (5), (6) by which the two images made by the separator lens (4) are photoelectrically transformed, and a circuit (7) by which a signal processing is performed to judge the accuracy of focusing from signal charges induced in the aforesaid line image sensors (5) and (6) corresponding to the distribution of the light intensity.

Hereby, the images on the aforesaid line image sensors from the aforesaid separating lens come closer to the light axis (8) when the focused image of the remote object is located in front of the aforesaid image forming means, and they depart farther from the light axis (8) when the focused image of the remote object is located behind the image forming means. When the range finding is accurate, the focused image is located in the predetermined specific portion away from the light axis. Due to this fact, the range finding process is performed by the measurement of the distance of the image from the light axis (8) by the signal induced in the line image devices (5), (6).

To detect a relative position on the line image sensors (5) and (6), a method of phase difference detection is employed. This is obtained by a calculation of a correlation value of the formula (1) for two images on line image sensors (5) and (6), and judgment for the focusing accuracy is done through a detection based on the relative amount of shift (phase difference) of the two images while the correlation is minimized.

$$H(L) = B(K) - R(K-L-1) \tag{1}$$

In equation (1), L is, for example, an integer variable between 1 and 9, which corresponds to the aforesaid relative amount of shift.

B(K) is, for example, a serial output signal from each element of one of the line image sensors (5).

R(K-L-1) is a serial output signal from each element of the other line image sensors (6). Nine correlations H(1), H(2), ... H(9) are obtained from the aforesaid formula (1) when L is changed from 1 to 9. For example, in case it is predetermined that the image is correctly focused on the image forming means when H(5) is minimized, the phase difference between L=5 and other values which give the minimized H on the measurement is obtained as the actual value to correct focusing.

Figure 8:
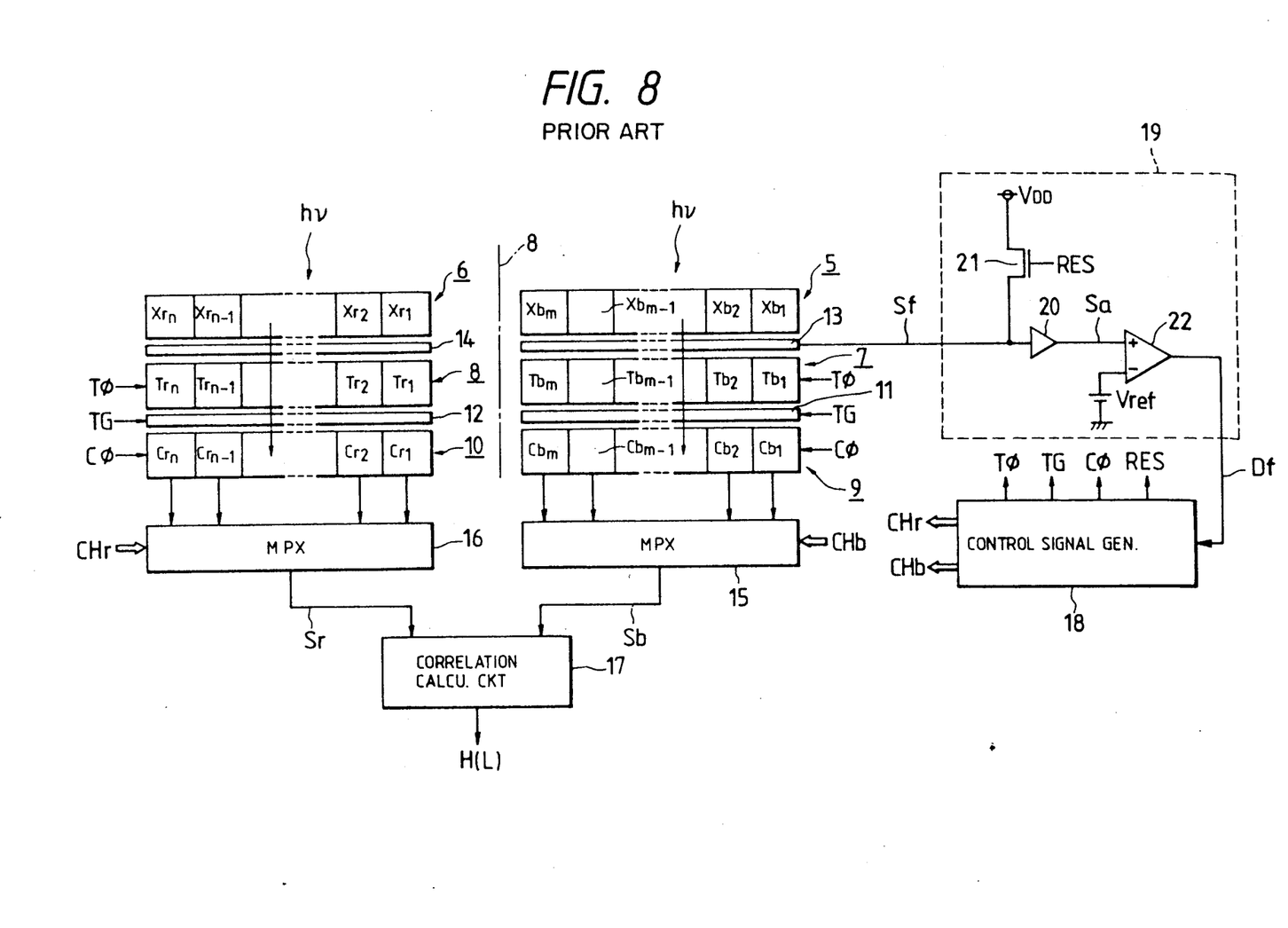
FIG. 8 is a block diagram of one example of the automated range finding system of the prior art in which photo sensors and signal processing circuits are illustrated.

FIG. 8 is a block diagram of an example of the processing circuit in FIG. 7. In this example, the aforesaid processing circuit (7), line image sensors (5) and (6) are formed on a semiconductor chip module.

In FIG. 8, elements (5) and (6) are line image sensors, and predetermined numbers of photo diode cells (bl) ~(bm), (rl) ~(rn) are arranged in line at opposite positions for the light axis (8). A circuit is arranged next to the aforesaid line image sensors to transfer the charges induced in the image sensors. Herein, the elements (7) and (8) are CCD charge storage devices which comprise charge storage elements T(bl) ~T(bm), T(rl) ~T(rn) corresponding to each photo diode X(bl) ~X(bm), X(rl) ~X(rn). The elements (9) and (10) are CCD charge transferring devices which comprise charge transferring elements C(bl) ~C(bm), C(rl) ~C(rn) corresponding to each charge storage element T(bl) ~T(bm), T(rl) ~T(rn). When transferring gates (11) and (12) are turned "ON" by a gate control signal TG, charges which are stored in each storage element T(bl) ~T(bm), T(rl) ~T(rn) in the charge storage means (7) and (8) are transferred in parallel to the charge transferring elements C(bl) ~C(bm), ~C(rl) C(rn). The elements (13) and (14) are floating gates which generate voltages corresponding to the amount of signal charge induced in the photo diodes X(bl) ~X(bm), X(rl) ~X(rn). Herein, because the floating gates (13) and (14) are deposited on the charge transferring path with electric field-coupling (non contactedly) between the line image sensors (5) and the charge storage means (7), and the line image sensors (6) and the charge storage means (8), respectively the amount of induced signal charges can be read out without destruction.

The elements (15) and (16) are multiplexers for parallel-serial transformation of the parallel outputted signals from the charge transferring elements C(bl) ~C(bm), C(rl) ~C(rn) to serial signals S(b) and S(r). The element (17) is a circuit for calculating the correlation between the signals S(b) and S(r) and outputting a result H(L) of the aforesaid formula (1).

The element (18) is a circuit which generates control signals required for the overall operation such as a gate electrode signal TΦ which is applied to the so-called charge transferring gate of the charge storage means (7) and (8), a gate control signal TG which operates the "ON" and "OFF" status of the transferring gates (11) and (12), a gate electrode signal CΦ which is applied to the so-called charge transferring gate of the charge storage means (9) and (10) and channel switching signals CH(b) and CH(r) for multiplexers (15) and (16).

In the figure, the charge detecting circuit (19), which is indicated within the dotted line, comprises an impedance transforming amplifier (20) connected to the floating gate (13) to receive the signal therefrom, a resetting transistor (21) which is connected between an input terminal of the aforesaid amplifier and an electric voltage source V(DD), and a comparator (22) to which is applied a reference voltage V(ref) at an inverting input terminal and an output signal S(a) from the amplifier (20) at a non inverting input terminal. Comparator (22) outputs a detecting signal D(f) when the voltage of signal S(a) corresponding to a signal S(f) becomes higher than the reference voltage V(ref). When the detection signal D(f) is supplied to the control signal generating circuit (18), it stops the exposure process for the range finding operation by outputting a gate control signal Tφ by which the transferring gate TG is closed.

In this context, the floating gate (13) stops the exposure process to prevent an occurrence of overflow of signal charges and to maintain the precise measurement for the correlation H(L), as it is determined that a permissible amount for charge capacity is obtained for each element of the charge storage means (7), (8) and charge transferring means (9), (10) when signal S(a), which represents an average of the signal charges induced in the photo diodes X(bl) ~X(bm) (which are the same as the charges induced in the photo diodes X(rl) ~X(rn)), reaches the predetermined voltage level V(ref). Hereby, the exposure process for range finding is begun by clamping the signal S(f) to the voltage source V(dd) by turning "ON" a transistor (21) temporarily. As the signal S(f) changes according to the amount of light received, the time length for exposure can be determined according to the amount of light incident from the remote object without occurrence of saturation.

However, though the aforementioned improvements in the prior art are intended to ensure dynamic range with control of the amount of light received through a calculation of the average value of charge signal induced in all photo diodes, they could not successfully prevent the occurrence of signal saturation in the case when there are higher brightness portions in the remote object compared to the background of the object. In such case, the signal corresponding to the aforesaid higher brightness portion could not help but saturate the measurement based on the average value of all the photo diodes. Further, in the case where one portion of the remote object is much brighter with a dark background, even though some photo diodes have saturated with over-induced charges, the average signal S(a) tends to require a long exposure time to reach the reference level V(ref). This causes an increase of dark current at the sensors in exposure time, which makes the signal to noise ratio worse.

SUMMARY OF THE INVENTION

The present invention is intended to overcome the previously stated difficulty. An object of the present invention is to provide a peak level detecting apparatus for image sensors which successfully realizes a detection of the remote object patterns without any saturation in photoelectric devices by adjusting the exposure time with the detection of induced signal charge in at least one of the photo-electric devices reaching the predetermined peak level, in order to improve the dynamic range and the signal to noise ratio.

This object is accomplished in accordance with the present invention by a peak level detecting apparatus for detecting the occurrence of the maximum signal charge within the dynamic range of the photoelectric device comprising:
  a) plural photoelectric devices,
  b) gates by which the potential barriers are settled between adjoining said photoelectric devices,
  c) drains by which signals are generated corresponding to the signal charges that flow over said potential barriers made by MOS gates adjacent to said plural photoelectric devices, and.
  d) detecting circuits by which the occurrence of saturation in at least one device among said plural photoelectric devices is detected through said drains.

In the peak level detecting apparatus for image sensors in accordance with the present invention of the aforesaid composition, the occurrence of saturation in at least one photoelectric device with the overflow of said potential barrier, can be detected as a injection of charge in the aforesaid drain. This realizes effective usage of dynamic range without saturation in the image sensors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

Herein, the key notations are, p(bl) ~P(bm), P(rl) ~P(rn), RD1 ~RD(rn); photo diodes
S(bl) ~S(bm), S(rl) ~S(rn) charge storage elements
R(bl) ~R(bm), R(rl) ~R(rn), TH; barrier gates
G(bl) ~G(bm), G(rl) ~G(rn); clearing gates
D(bl) ~D(bm), D(rl) ~D(rn), DN; drains
(24), (25) detecting circuit
(26), (27) differential amplifier
C; capacitor device

DESCRIPTION OF THE PREFERRED EMBODIMENT

Figure 1:
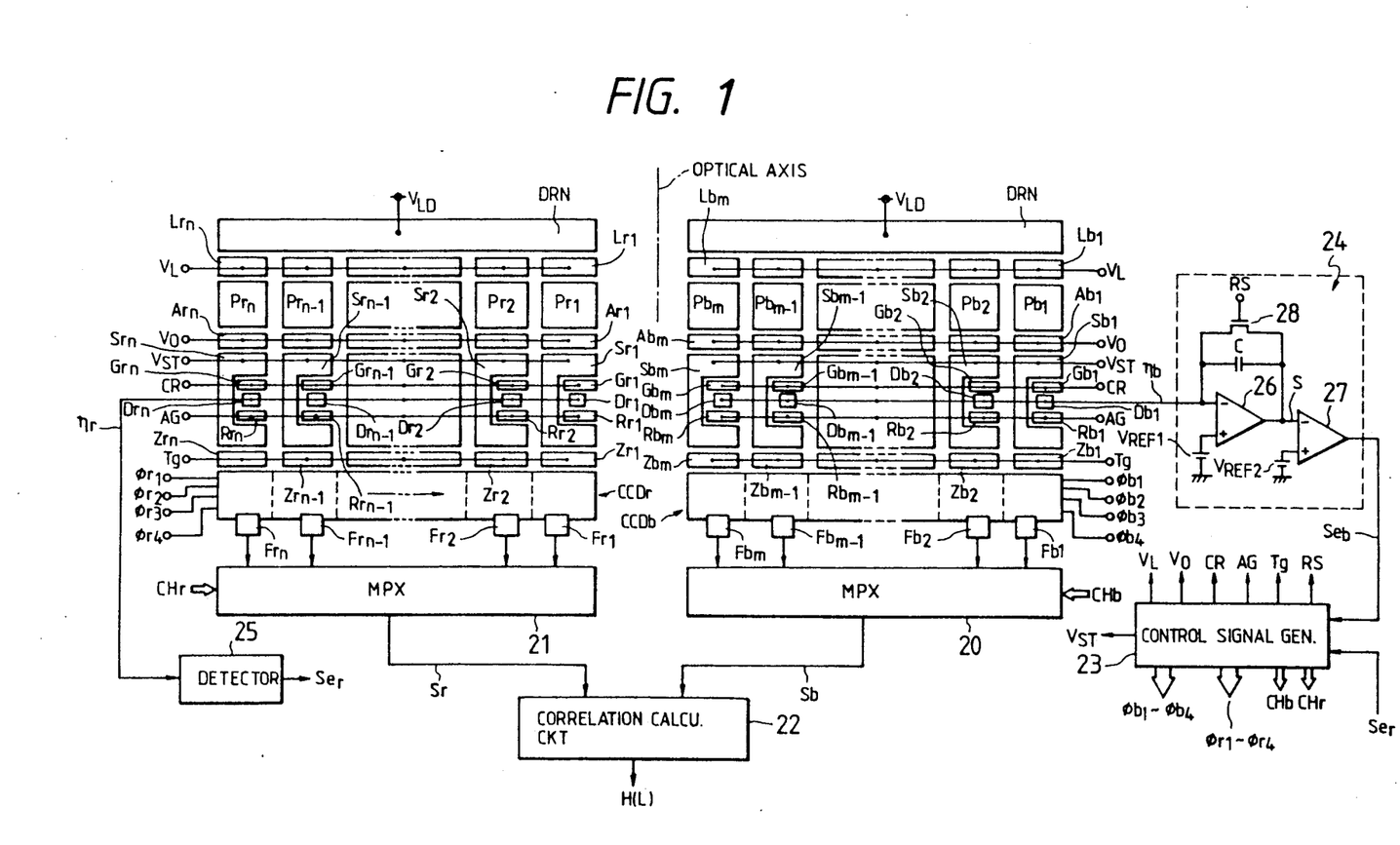
FIG. 1 is a block diagram of one embodiment in which the peak level detecting apparatus for image sensors of the present invention is applied to an automated range finding system.

FIG. 1 is a block diagram of a preferred embodiment in which the peak level detecting apparatus for image sensors of the present invention is applied to an automated range finding system, which function corresponds to FIG. 8.

Hereinafter, the explanation will be given with respect to photo sensors. In FIG. 1, a portion of the peak level detecting apparatus for basic photo sensors is illustrated in the right side of the figure, and that for reference photo sensors is illustrated in the left side of the figure with a center line representing the light axis. The portions are arranged at predetermined distances from the light axis. Both portions are formed on the same substrate of a semiconductor chip with a cell structure by semiconductor technology for integrated circuits.

The elements P(bl) ~P(bm), P(rl) ~P(rn) are photo diodes with the same shape, and each photo diode is separated electrically. At one electrode of the photo diodes P(bl) ~P(bm), P(rl) ~P(rn), a drain layer D(Rn) is formed to discharge unnecessary charges through discharge gates L(bl) ~L(bm), L(rl) ~L(rn). The drain layer is made with an n+impurity layer to which the predetermined voltage V(LD) is applied. The discharge gates L(bl) ~L(bm), L(rl) ~L(rn) are turned "ON" and "OFF" by a voltage level of a control signal V(L).

To the other electrode of the photo diodes P(bl) ~P(bm), P(rl) ~P(rn), U shaped charge storage means S(bl) ~S(bm), S(rl) ~S(rn) are formed through the barrier gates A(bl) ~A(bm), A(rl) ~A(rn). The barrier gates A(bl) ~A(bm), A(rl) ~A(rn) generate potential barriers in the substrate of the micro chip, which correspond to the voltage level of the bias signal VO which is applied to the surface electrodes of the barrier gate. The charge storage elements S(bl) ~S(bm), S(rl) ~S(rn) also generate the potential profile corresponding to the voltage of the bias signal V(ST) which is applied to the U-shaped surface electrode. In the blank portion of the U-shaped charge storage elements S(bl) ~S(bm), S(rl) ~S(rn), drains D(bl) ~D(bm), D(rl) ~D(rn), which are made with N+type impurity layers, are formed to be surrounded by a pair of a clearing gate and a barrier gate, G(bl)/R(bl), Gb2/Rb2, ~G(bm)/R(bm), G(rl)/R(rl), Gr2/Rr2, ~G(rn)/R(rn). In the clearing gates G(bl) ~G(bm), G(rl) ~G(rn), the potential barriers corresponding to the voltage level of the control signal CR which is applied to their surface electrode, are generated, and another potential barrier is generated in other barrier gates R(bl) ~R(bm), R(rl) ~R(rn) which correspond to the voltage level of the signal AG applied to their surface electrodes. Herein, the clearing gates G(bl) ~G(bm), G(rl) ~G(rn) have another function to discharge the unnecessary charges of the photo diodes P(bl) ~P(bm), P(rl) ~P(rn) to the charge storage elements S(bl) ~S(bm), S(rl) ~S(rn) with a deeper potential barrier by a high temporary voltage. Moreover, the transferring gates Z(bl) ~Z(bm), Z(rl) ~Z(rn) and the charge transfer lines CCDb, CCDr which are made by charge coupled devices are formed in said order at the output electrode of the charge storage elements S(bl) ~S(bm), S(rl) ~S(rn) of the charge storage means. The transferring gates Z(bl) ~Z(bm), Z(rl) ~Z(rn) are operated to be "ON" and "OFF" with a control signal T(g) which is applied to their surface electrodes. The charge transferring lines CCDb and CCDr transfer the signal charges with a clock signal of $\phi(bl) \sim \phi(b4)$, $\phi(rl) \sim \phi(r4)$ by a so-called four phase driving operation. Each element of the charge transferring means transfers one signal charge with four phase driving. The floating gates F(bl) ~F(bm), F(rl) ~F(rn) are formed adjoining each transferring element of the aforesaid charge transferring means in order to output the voltage signals which correspond to the signal charge stored in each charge transferring element without any destruction. Herein, the charge transferring line CCDb at the basic photo sensor side is controlled to transfer the signal charge between adjoining elements only for draining the signal charges, while the charge transferring line CCDr at the reference photo sensor side is controlled to transfer signal charge horizontally between adjoining elements at any time. The signals generated in both floating gates F(bl) ~F(bm), F(rl) ~F(rn) are received by the multiplexers (20) and (21) and then serially outputted as signals Sb and Sr by a parallel-serial transformation with channel indication signals CHb and CHr for a predetermined time interval.

The explanation of the composition of the photo sensors are as described above. The outputted signals Sr and Sb are supplied to a correlation calculation circuit (22) to get the result of the correlation value H(L) of the aforesaid formula (1).

The entire operation of the automated range finding contains ordered steps of:

a) discharging unnecessary charges in the photo diodes P(bl) ~P(bm), P(rl) ~P(rn) to the drain D(Rn), b) exposing the photo diodes P(bl) ~P(bm), P(rl) ~P(rn) to the image of the remote object for an appropriate time interval, and c) supplying the result of the calculation of the correlation H(L).

The system is controlled by signals V(L), V(0), CR, AG, T(g), V(st), $\phi(bl)$ $\phi(b4)$, $\phi(rl) \sim \phi(r4)$, CH(b) and CH(r) which are supplied from the control signal generating circuit (23).

The circuit described above is made by so-called C-MOS manufacturing technology for semiconductor integrated circuits applied with two layer wiring technology.

Each element and surface electrode of the aforementioned example are formed in the first polysilicon layer and wiring (which are indicated with marks of ---- in FIG. 1) is formed in the second polysilicon layer utilizing the technology such as two layer wiring technology.

Furthermore, the peak level detecting apparatus for image sensors of the present invention contains detection circuits (24) and (25) to determine whether the permissible amount of charge capacity has been reached in at least one of the aforesaid charge storage elements S(bl) ~S(bm), S(rl) ~S(rn) in the exposure process. Because both circuits (24) and (26) have same composition, hereinafter an explanation will be given of FIG. 1 for only the detection circuit (24) as an example. The circuit comprises an operational amplifier (26) and a comparator (27). To the inverted input terminal of the operational amplifier (26), wirings to all the drains D(bl) ~D(bm) are connected commonly to receive a voltage signal n(b) which is generated in the aforesaid wirings. To the other non-inverted input terminal of the operational amplifier (26), a predetermined bias voltage V(REF1) (for example 3.5 V) is applied, and a capacitor device C and a switching device (28) are connected in parallel between the output terminal and the inverted input terminal. The output terminal of the operational amplifier (26) is connected to the inverted input terminal of the comparator (27)a, and a predetermined reference voltage V(REF2) is applied to the non-inverted input terminal of the comparator (27) to supply a detection signal S(eb), which is generated at the output terminal, to the control signal generating circuit (23). The detector (25) on the reference side of the apparatus receives the voltage signal η(r), which corresponds to η(b), and supplies a detection signal S(er), which corresponds to the detection signal S(eb), to the control signal generating circuit (23). The control signal generating circuit (23) stops the exposure process when a change, explained later, occurs in the aforesaid detection signals S(eb) and S(er).

This is achieved by stopping the signal charge flow to the signal storage elements S(bl) ~S(bm), S(rl) ~S(rn), for example, by breaking contact with the barrier gates A(bl) ~A(bm), A(rl) ~A(rn) and at the same time to make contact with the draining gates L(bl) ~L(bm), L(rl) ~L(rn) in order to maintain the control signal at the predetermined level. Herein, the switching device (28) is turned "ON" temporarily and discharges the unnecessary signal charge in the capacitor device C by a reset signal RS which is output from the control signal generator (23) just before the exposure process is begun. The capacitance of the capacitor device C should preferably be small to ensure acute sensitivity of the detectors (24) and (25).

Figure 2:
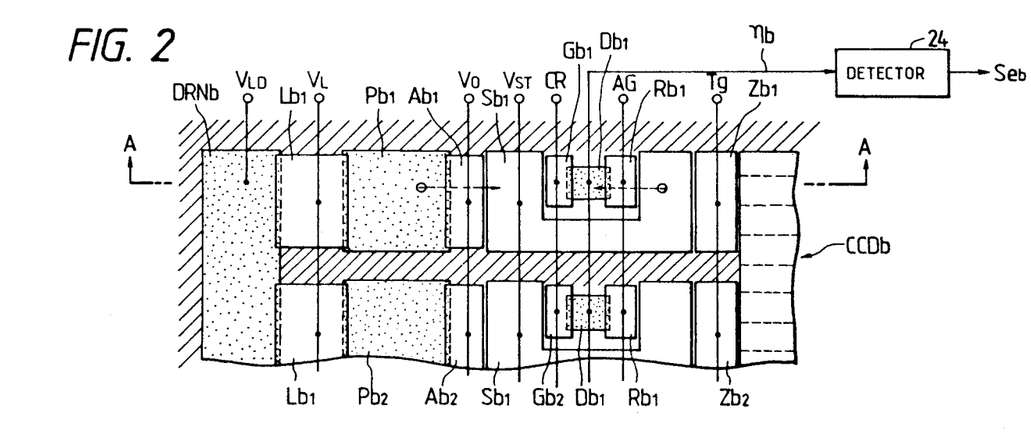
FIG. 2 is an expanded view of the block diagram of FIG. 1, in which a directly related portion of the diagram is illustrated.
Figure 3:
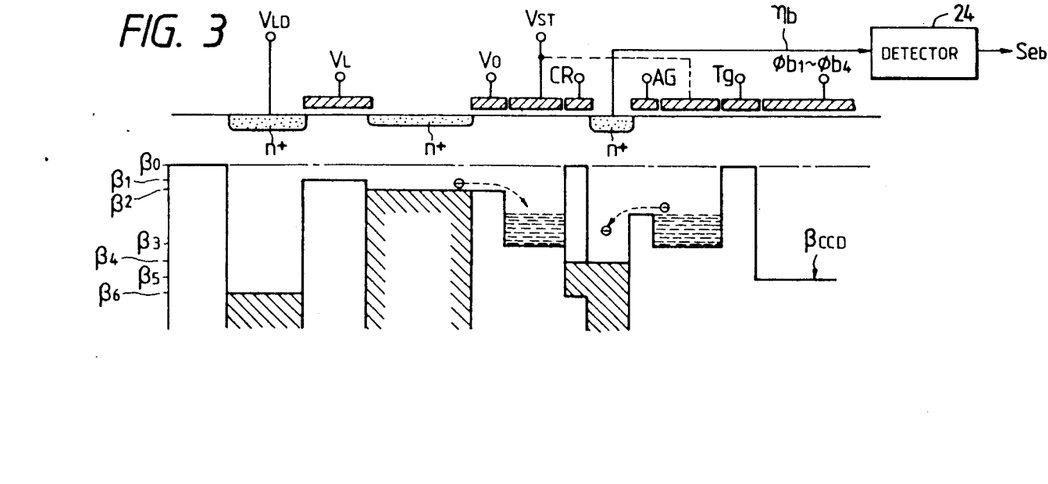
FIG. 3 is a cross sectional view of one portion of the apparatus of FIG. 2 by which the potential profile of the portion cut along the line A-A in FIG. 2 is illustrated.
Figure 4:
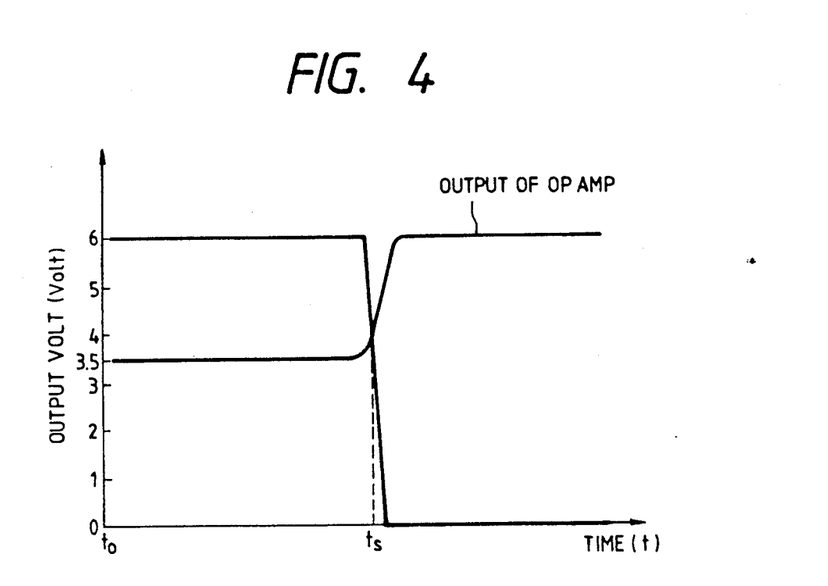
FIG. 4 is a timing chart of one example of an operating process of a detecting circuit.

Hereinafter, the operation of the peak level detecting apparatus for image sensors according to the present invention will be explained with reference to FIG. 2, FIG. 3 and FIG. 4. The portion of the apparatus regarding the signal detection means will first be explained in further detail. A photo cell to operate a signal charge generated in the photo diode P(bl) which is arranged in rightmost part in the charge storage portion in FIG. 1 is illustrated in FIG. 2.

The photo cell comprises:
a) isolation indicated by slanted lines to separate adjoining cells,
b) an n+type impurity layer indicated by dots which is doped in the P-well,
c) plural surface electrodes indicated by solid lines which are formed by a polysilicon layer and
d) wirings indicated by marks of ---- to connect among the aforesaid surface electrodes in the figure. A side view L a vertical cut along the line A-A in FIG. 2 is illustrated in FIG. 3, and the potential profile for the side view is also illustrated in the FIG. 3.

The status of the potential profile just before the exposure process begins, is described as follows. The U-shaped charge storage element has a Fermi level of β3 with a predetermined voltage V(st) (3.5 V in this example), which is generated in U-shaped form from a top view because the surface electrode of the storage element has a U-shaped form. The drain D(bl), which is surrounded by the charge storage element, has a Fermi level of β4 after the capacitor device C in FIG. 1 has been discharged. The potential level of the gate G(bl) which is arranged between the aforesaid two devices is decreased to the level β4 by a signal CR of high voltage in order to discharge unnecessary charge in the storage element S(bl) to the detector (24) through the drain D(bl) when the status is reset before the exposure process. Then the gate G(bl) has a potential of level β0 given by a signal CR with low voltage (0 volts at the moment in this example) in the exposure process. The other gate R(bl) has a potential of level β2 from an applied voltage AG (adjusted within the range from 1.5 to 3.5 V). The transferring gate Z(bl) is biased to have a potential β0 by a signal T(g) when it does not transfer charges to the charge coupled device line CCDb, and it is biased to have a potential between the level β3 and β(CCD), which is the level of the potential well of the charge coupled device line CCDb when charge transfer is to occur. The drain layer D(Rn) is biased to have a potential of β6, which is the deepest potential in this example, by the predetermined applied voltage Vld (6V). The potential of the gate L(bl) is decreased to be equal to a signal V(L) with high voltage at the reset process before the exposure begins, and it is biased to be β1 when the signal V(L) becomes a low voltage (1.2 V). The barrier gate A(bl) has a potential of β2 which is set by an applied voltage V0. Herein, as the charge storage element S(bl) and the drain D(bl) are isolated together so that signal charge cannot pass directly through them, the charges are transferred through the gates G(bl) and R(bl) without fail.

With the potential profile as described above, a signal charge (indicated by a mark "·" in the figure) induced by a photo electric effect in the photo diode P(bl) is transferred to the charge storage element S(bl) through the barrier gate A(bl) and is stored therein when the exposure process is begun. The accumulation process is continued by the potential barrier β3 until the potential level of the charge storage element S(bl) becomes equal to that of the gate AG. When the charge accumulation is continued to the level of β3, the signal charge flows into the drain D(bl) by an overflow from the potential barrier and it changes the voltage of a signal η(b) which is applied to the detection circuit (24). According to this change, the capacitor device C in the detection circuit (24) is charged and the output signal level from the operational amplifier (26) is increased gradually. When the charged voltage becomes larger than V(ref2) (4 V) at the time t(s) as shown in FIG. 4, the detection signal S(eb) is inverted to the level "low". The inversion is detected by the control signal generator (23), which outputs a command to stop the exposure process. By these sequential processes, the exposure process is restricted to a time period between time t(0) when it is begun and time t(s) when it is stopped.

In this example, explanation was given only of the cell including the charge accumulation element S(bl). However, the processes for the other cells are substantially the same as the aforesaid cell for the charge accumulator S(bl). The operation for the other cells begins after the same potential profile was set, and because all drains are connected to the detection circuit (24) with a common wiring, (cells being connected to the detection circuit (25) for the case of the reference side) when the signal charge in at least one of the charge accumulator elements begins to flow over the potential barrier, the signal S(eb) changes to the "low" level. By this construction, the detection circuits (24) and (25) are not designed to stop the exposure process when the average of the charges stored in all charge accumulator elements becomes larger than a predetermined threshold level, but are designed to stop the exposure process when only one of the charge accumulator elements attains the saturation level. Due to this design, all signal charges are kept within the level at which a permissible amount of charge is contained in the charge accumulator element, so that the signals S(b) and S(r) which are supplied to the correlation calculation circuit (22) do not contain any clip. Thus, the result of the calculation is based on the actual light levels which properly correspond to the remote object, and precise range finding can be realized.

In the above described example, the apparatus comprises barrier gates R(bl) ~R(bm), R(rl) ~R(rn) to set the potential barrier to detect the predetermined peak level, and also gates G(bl) ~G(bm), G(rl) ~G(rn) for the purpose of discharging unnecessary charges. As for another embodiment of the peak level detecting apparatus for image sensors, the gates G(bl) ~G(bm), G(rl) ~G(rn can be neglected. In this embodiment, the function of discharging the unnecessary charges is performed by the barrier gates R(bl) ~R(bm), R(rl) ~R(rn) with proper adjustment of the voltage level of the control signal AG. This modification can simplify the overall structure of the apparatus. Another simplification can be accomplished by utilizing only one of the detecting circuits (24) and (25) because they have the same structure and achieve the same function.

Figure 5:
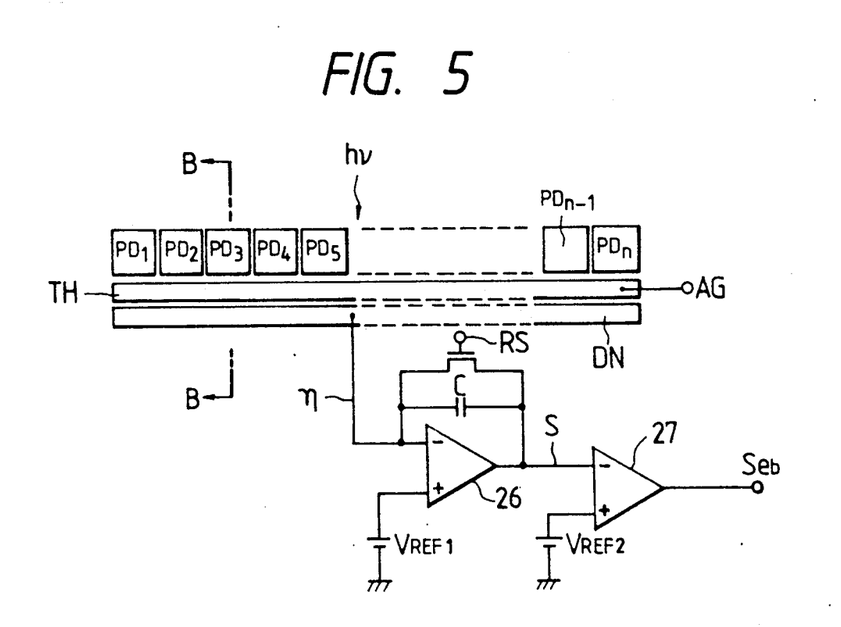
FIG. 5 is a block diagram of another embodiment of a peak level detecting apparatus for image sensors of the present invention.

Hereinafter, another embodiment of a peak level detecting apparatus for image sensors will be explained with reference to FIG. 5. The embodiment illustrated in FIG. 1 is applied to a peak level detecting apparatus which is formed in a single semiconductor chip for an automated range finding apparatus. The embodiment in FIG. 5 illustrates a peak level detecting apparatus for image sensors, as an embodiment of the present invention with a more fundamental structure having applicability for an optical apparatus not limited to the automated range finding apparatus.

The apparatus includes:
a) plural photo diodes PD(1) ~PD(n) which are arranged in line form and isolated from each other,
b) a barrier gate TH which is formed adjoining the plural photo diodes PD(1) ~PD(n) which is made of a poly silicon layer, for example, and
c) a drain DN which is formed parallel to and adjoining the barrier gate TH, and which is made of n+impurity layer on a P-well of the semiconductor substrate.

All the elements are formed by C-MOS semiconductor manufacturing technology.

The barrier gate TH generates a potential barrier of a predetermined level in the substrate by a predetermined voltage signal AG. Herein, the voltage of the signal AG is maintained at the predetermined level for the exposure interval of the photo diodes PD1 ~PDn, however, before the exposure, unnecessary charges in the photo diodes PD1 ~PDn can be discharged by raising the voltage of the signal AG in order to make the potential deeper.

The drain DN is connected to a detection circuit similar to the detection circuit (24) in the above described example. When the induced charge in at least one of the photo diodes PD1 ~PDn passes over the potential barrier during the exposure, a voltage $\eta$ generated in the drain DN is changed. This change is detected by the detection circuit so as to reverse the output signal S(eb). Hereby, the same or the corresponding components of the detection circuit (24) in FIG. 1 are indicated with the same reference numerals in FIG. 5.

Figure 6:
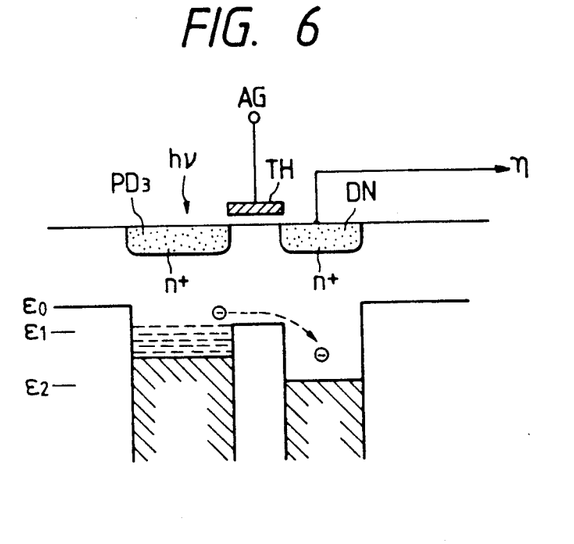
FIG. 6 is a cross sectional view of one portion of the apparatus of FIG. 5 by which the potential profile of the portion cut along the line A-A in FIG. 5 is illustrated.

FIG. 6 illustrates a cross sectional view of the peak level detecting apparatus for image sensors in FIG. 5, along the line B-B, and the potential profile of the semiconductor substrate corresponding to the cross sectional view. The Fermi level of the isolation is set at the highest level $\epsilon(0)$. The potential barrier made by the signal AG is set at $\epsilon(1)$, and the Fermi level of the drain DN is set at $\epsilon(2)$. These three levels are controlled to hold a relation, $\epsilon(0) > \epsilon(1) > \epsilon(2)$. Hereby, to discharge the unnecessary charges from the photo diodes PD1 ~PDn to the drain DN, the potential $\epsilon(1)$ is changed to be deep at the level of $\epsilon(2)$ by temporarily applying the high voltage signal AG in the resetting process before the exposure.

With the embodiment as described above, because there is only one coupling between the barrier gate TH by which the potential barrier is made, and the drain DN by which the signal charge flowing over the potential barrier is detected, which is commonly possessed for all of the photo diodes, the composition of the whole apparatus can be simplified.

As for a specific application, the automated range finding apparatus of the prior art in FIG. 8 can use the peak level detecting circuit in FIG. 5 instead of the charge detection circuit (19) in FIG. 8. In this embodiment, the peak level detection can be accomplished in the same manner for the photo diodes X(rl) ~X(rn), X(bl) ~X(bm) in FIG. 8 with the arrangement of the photo diodes PD(1) ~PD(n) corresponding to that of the photo diodes X(rl) ~X(rn), X(bl) ~X(bm) in FIG. 8. As for other applications of the peak level detecting apparatus for image sensors of the present invention, it can be used in an automated exposure apparatus in which the most appropriate exposure can be realized. With the arrangement of the plural photo diodes PD1 ~PDn in a predetermined field angle of a camera, so called spot measurement which is performed with a base of the strongest light value portion, can be realized utilizing the detection of signal charge reaching a predetermined level in at least one of the photo diodes.

As described above, the peak level detecting apparatus for image sensors of the present invention can be applied to not only an automated range finding apparatus and and automated exposure apparatus in the above described embodiments, but also various optical apparatus.

The invention being thus described, it will be obvious that the same may be varied in many ways. Such variations are not to be regarded as a departure from the spirit and scope of the invention and all such modifications as would be obvious to those skilled in the art are intended to be included within the scope of the following claims.

What is claimed is:

1. A peak level detecting apparatus for an image sensor used in an optical apparatus, comprising:
   a plurality of photoelectric devices arranged adjacently;
   gate means for generating a potential barrier proximate said photoelectric devices;
   drain means connected to said photoelectric devices through said gate means, for generating a drain signal corresponding to a signal charge flowing over said potential barrier; and
   detection means for detecting a change in said drain signal indicating that at least one of said photoelectric devices has reached a signal charge saturation level, said detection means including
   a differential amplifier having a predetermined bias voltage applied to one input terminal thereof, and
   capacitor means connected between a second input terminal and an output terminal of said differential amplifier, which said second input terminal is connected to said drain means for detecting said signal change of said drain signal as a change of charge in said capacitor means.

2. A peak level detecting apparatus as defined in claim 1, said drain means comprises a semiconductor material having impurities contained therein.

3. A peak level detecting apparatus for an image sensor comprising:
   a plurality of photoelectrical devices arranged adjacently;
   first barrier means, arranged adjacent said plurality of photoelectric devices, for generating a potential barrier with respect to said plurality of photoelectric devices;
   U-shaped charge storage means, arranged adjacent said first barrier means opposite that of said plurality of photoelectric devices, for storing signal charge, generated in said plurality of photoelectric devices, which has passed said potential barrier of said first barrier means;
   drain means, coupled to said U-shaped charge storage means, for generating a detection signal corresponding to said signal charge stored in said U-shaped charge storage means; and
   detection means, coupled to said drain means, for detecting a change in said detection signal and for outputting a signal charge saturation signal indicating that at least one of said photoelectric devices has saturated.

4. The peak level detecting apparatus for an image sensor of claim 3, said detection means comprising:
   an operational amplifier, having a first predetermined bias voltage applied to a first terminal and said detection signal coupled to a second terminal, for generating as an output an amplified signal;
   a capacitor, coupled across said second terminal and said output of said operational amplifier, for storing charge corresponding to said detection signal;
   switch means, coupled in parallel across said capacitor, for discharging said charge corresponding to said detection signal accumulated in said capacitor; and
   comparison means, having a second predetermined bias voltage applied to a first terminal and said amplified signal applied to a second terminal, for generating said signal charge saturation signal.

5. The peak level detecting apparatus for an image sensor of claim 3, said plurality of photoelectric devices comprised of photodiodes.

6. The peak level detecting apparatus for an image sensor of claim 3, further comprising second barrier means, arranged between said U-shaped charge storage means and said drain means, for
   discharging unnecessary charges of said plurality of photoelectric devices to said U-shaped charge storage means, and
   generating an additional potential barrier to set a predetermined peak level corresponding to an amount of stored signal charge of said U-shaped charge storage means necessary to direct generation of said detection signal by said drain means.

7. The peak level detecting apparatus for an image sensor of claim 6 further comprising:
   transfer means, arranged adjacent said U-shaped charge storage means, for transferring said stored signal charge to a processing means for image processing.

8. The peak level detecting apparatus for an image sensor of claim 3, further comprising:
   clearing means, arranged between said U-shaped charge storage means and a first side of said drain means, for discharging unnecessary charges of said plurality of photoelectric devices to said U-shaped charge storage means;
   second barrier means, arranged between said U-shaped charge storage means and a second side of said drain means opposite said first side, for generating an additional potential barrier to set a predetermined peak level corresponding to an amount of stored signal charge of said U-shaped charge storage means necessary to direct generation of said detection signal by said drain means.

9. The peak level detecting apparatus for an image sensor of claim 8 further comprising:
   transfer means, arranged adjacent said U-shaped charge storage means, for transferring said stored signal charge to a processing means for image processing.

10. The peak level detecting apparatus for an image sensor of claim 9 further comprising a plurality of respective said first and second barrier means, U-shaped charge storage means, drain means, clearing means and transfer means, each corresponding in number to said plurality of photoelectric devices and arranged in corresponding columns adjacent one another.

11. The peak level detecting apparatus for an image sensor of claim 10,
   said clearing means, drain means and second barrier means arranged consecutively within the open portion of the U-shaped portion of said U-shaped charge storage means.

12. The peak level detecting apparatus for an image sensor of claim 10 further comprising a plurality of respective said first and second barrier means, U-shaped charge storage means, drain means and transfer means, each corresponding in number to said plurality of photoelectric devices and arranged in corresponding columns adjacent to one another.

13. The peak level detecting apparatus for an image sensor of claim 12, said drain means and second barrier means arranged within the open portion of the U-shaped portion of said U-shaped charge storage means.

14. A peak level detecting apparatus for an image sensor comprising:
- a plurality of photoelectric devices arranged adjacently;
- barrier means, arranged adjacent said plurality of photoelectric devices, for generating a potential barrier with respect to said plurality of photoelectric devices;
- charge storage means, arranged adjacent said barrier means opposite that of said plurality of photoelectric devices, for storing signal charge generated in said plurality of photoelectric devices which has passed said potential barrier of said barrier means;
- drain means, coupled to said charge storage means, for generating a detection signal corresponding to said signal charge stored in said charge storage means; and
- detection means, coupled to said drain means, for detecting a change in said detection signal and for outputting a signal charge saturation signal indicating that at least one of said photoelectric devices has saturated.

15. A method of preventing saturation in an optical apparatus comprising the steps of:
- receiving in a plurality of photodiodes image signals corresponding to an image of interest to generate signal charges corresponding to said image signals;
- generating a first potential barrier in first barrier gates arranged adjacent to the plurality of photodiodes;
- storing in a charge storage means the signal charges corresponding to said image signals which pass over said potential barrier generated in the barrier gates;
- generating a second potential barrier in second barrier gates, arranged adjacent the charge storage means, to set a predetermined level corresponding to an amount of said stored signal charge accumulated in the charge storage means in which additional accumulated stored signal charge will pass to a drain means;
- generating a detection signal in the drain means when said additional accumulated stored signal charge passes said second potential barrier to the drain means;
- detecting a change in said detection signal, in a detection means, to output a signal charge saturation signal indicating that at least one of the plurality of photodiodes has saturated; and
- stopping exposure of the plurality of the photodiodes of the optical apparatus in accordance with said signal charge saturation signal to prevent further saturation.

16. A method of detecting a peak level of an image sensor comprising the steps of:
- receiving in a plurality of photodiodes image signals corresponding to an image of interest to generate signal charges corresponding to said image signals;
- generating a potential barrier in barrier gates arranged adjacent to the plurality of photodiodes;
- generating a detection signal in a drain means when said signal charges corresponding to said image signals pass over said potential barrier of the barrier gates;
- detecting a change in said detection signal, in a detection means, to output a signal charge saturation signal indicative that at least one of the plurality of photodiodes of the image sensor has saturated; and
- stopping exposure of the plurality of photodiodes of the image sensor in accordance with said signal charge saturation signal to prevent further saturation.

* * * * *